United States Patent
Cheng et al.

(10) Patent No.: US 10,622,493 B2
(45) Date of Patent: Apr. 14, 2020

(54) LIGHT DETECTING DEVICE, LIGHT DETECTING METHOD AND DISPLAY DEVICE

(71) Applicant: BOE TECHNOLOGY GROUP CO., LTD., Beijing (CN)

(72) Inventors: Chihjen Cheng, Beijing (CN); Pengpeng Wang, Beijing (CN); Wei Liu, Beijing (CN); Xueyou Cao, Beijing (CN); Xiaoliang Ding, Beijing (CN); Yanling Han, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/179,319

(22) Filed: Nov. 2, 2018

(65) Prior Publication Data

US 2019/0237591 A1    Aug. 1, 2019

(30) Foreign Application Priority Data

Jan. 31, 2018   (CN) .......................... 2018 1 0094862

(51) Int. Cl.
| | |
|---|---|
| *H01L 31/02* | (2006.01) |
| *G09G 3/20* | (2006.01) |
| *H01L 31/10* | (2006.01) |
| *G06K 9/00* | (2006.01) |

(52) U.S. Cl.
CPC .......... *H01L 31/02019* (2013.01); *G06K 9/00* (2013.01); *G09G 3/20* (2013.01); *H01L 31/10* (2013.01); *G09G 2320/0626* (2013.01); *G09G 2360/145* (2013.01)

(58) Field of Classification Search
None
See application file for complete search history.

(56) References Cited

U.S. PATENT DOCUMENTS

| 7,417,212 B2* | 8/2008 | Kakumoto | ........ H01L 27/14609 |
| | | | 250/208.1 |
| 2005/0248674 A1* | 11/2005 | Mabuchi | .............. H04N 5/3658 |
| | | | 348/308 |
| 2011/0007047 A1* | 1/2011 | Fujioka | ............... G02F 1/13338 |
| | | | 345/207 |

(Continued)

*Primary Examiner* — Christopher R Lamb
(74) *Attorney, Agent, or Firm* — Kinney & Lange, P.A.

(57) ABSTRACT

The light detecting device provided by the present disclosure includes a reset circuit, a photoelectric conversion circuit, a voltage follower circuit, a selection circuit, and a light fluctuation detecting circuit. The light fluctuation detecting circuit is connected to each of a light fluctuation detection control terminal, a photoelectric node and an input terminal of the voltage follower circuit. The light fluctuation detecting circuit is configured to enable or disable a connection between the photoelectric node and the input terminal of the voltage follower circuit. When the light fluctuation detecting circuit is turned off, a drain current of the light fluctuation detecting circuit may change as the brightness of light received by the light fluctuation detecting circuit changes. The voltage at the output node is used to determining brightness of light received by the photoelectric conversion circuit and whether is a fluctuation in the in the brightness of the light.

20 Claims, 2 Drawing Sheets

(56) References Cited

U.S. PATENT DOCUMENTS

| | | | | |
|---|---|---|---|---|
| 2012/0176355 A1* | 7/2012 | Sugita | .................. | G06F 3/0412 |
| | | | | 345/207 |
| 2012/0176357 A1* | 7/2012 | Katoh | .................. | G06F 3/0412 |
| | | | | 345/207 |
| 2013/0313412 A1* | 11/2013 | Kurokawa | ............ | G06F 3/0412 |
| | | | | 250/208.2 |
| 2017/0302869 A1* | 10/2017 | Ikuma | .................... | H04N 5/365 |

* cited by examiner

LIGHT DETECTING DEVICE, LIGHT DETECTING METHOD AND DISPLAY DEVICE

CROSS-REFERENCE TO RELATED APPLICATION

This application claims a priority to Chinese Patent Application No. 201810094862.3, filed on Jan. 31, 2018, the disclosures of which are herein incorporated by reference in their entirety.

BACKGROUND

The present disclosure relates to the field of light detecting technology, in particular to a light detecting device, a light detecting method and a display device.

At present, an APS (Active Pixel Sensor) circuit is used to detect an optical signal emitted by a light source. However, brightness of the light emitted by the light source may fluctuate, i.e., optical signal can include noise. For example, a backlight source of an LCM (Liquid Crystal Module) that drives an LED (Light Emitting Diode) by a current, so as to generate light, may have slight variations due to current noise. Consequently, the slight variations may be detected by a sensitive light detecting device and generate noise.

Optical fingerprint recognition technology mainly utilizes the principles of refraction and reflection of light. When a finger presses on a surface of a touch screen of a display device, a built-in light source of the display device projects light rays onto uneven fingerprint lines (i.e., valleys or ridges) of fingers. Since the light rays have different refraction angles and reflection intensities at pits and bumps on the lines, different currents may be generated when these light rays are projected onto a light sensitive sensor. By detecting these currents, positions of valleys and ridges on the fingerprint may be recognized, thereby making it possible to obtain a fingerprint image. However, in related art, when a finger touch on the touch screen has been detected, fingerprint recognition is further required. Since fingerprint recognition requires the determination of valleys and ridges, but the difference between the brightness of light corresponding to the valley and the brightness of light corresponding to the ridge is relatively small, any fluctuation in the light source at this time can have a greater impact on the identification of valleys and the ridges.

SUMMARY

In a first aspect, the present disclosure provides a light detecting device that includes: a reset circuit connected to a reset control terminal, a reset voltage terminal and a photoelectric node; a photoelectric conversion circuit connected to the photoelectric node and configured to convert a received optical signal into a corresponding electrical signal, the optical signal being output by a light source; a voltage follower circuit; a selection circuit connected to a selection control terminal, a follower node and an output node; and a light fluctuation detecting circuit connected to each of a light fluctuation detection control terminal, the photoelectric node and an input terminal of the voltage follower circuit, an output terminal of the voltage follower circuit being connected to the follower node. The light fluctuation detecting circuit is configured to enable or disable a connection between the photoelectric node and the input terminal of the voltage follower circuit under the control of the light fluctuation detection control terminal. When the light fluctuation detecting circuit is turned off, a drain current flowing through the light fluctuation detecting circuit changes as brightness of light received by the light fluctuation detecting circuit changes. A voltage at the output node is used to determine brightness of light received by the photoelectric conversion circuit and to determine whether there is a fluctuation in the brightness of the light received by the photoelectric conversion circuit.

According to some possible embodiments of the present disclosure, the light detecting device may further include: a photoelectric detection circuit connected to the output node and configured to detect the voltage at the output node; and a light fluctuation determining circuit connected to the photoelectric detection circuit and configured to determine whether there is the fluctuation in the brightness of the light received by the photoelectric conversion circuit based on the voltage at the output node.

According to some possible embodiments of the present disclosure, the light fluctuation detecting circuit may include a light fluctuation detecting transistor. A gate electrode of the light fluctuation detecting transistor may be a control terminal of the light fluctuation detecting circuit, a first electrode of the light fluctuation detecting transistor may be connected to the input terminal of the voltage follower circuit, a second electrode of the light fluctuation detecting transistor may be connected to the photoelectric node, and a drain current of the light fluctuation detecting transistor may change as brightness of light received by the light fluctuation detecting transistor changes.

According to some possible embodiments of the present disclosure, the light fluctuation determining circuit may be further configured to output a corresponding fluctuation indication signal based on a result of the determination of whether there is the fluctuation in the brightness of the light received by the photoelectric conversion circuit. The light detecting device may further include an optical signal processing circuit connected to the light fluctuation determining circuit and the photoelectric detection circuit, and configured to process the voltage at the output node detected by the photoelectric detection circuit based on the fluctuation indication signal and to obtain brightness of corresponding light based on a voltage obtained after the processing.

According to some possible embodiments of the present disclosure, the photoelectric detection circuit may include a voltage acquiring sub-circuit connected to the output node and configured to acquire an output voltage, the output voltage being the voltage at the output node.

According to some possible embodiments of the present disclosure, the photoelectric detection circuit may include: a voltage amplifying sub-circuit connected to the output node and configured to amplify the voltage at the output node to obtain an amplified output voltage; and a voltage acquiring sub-circuit connected to the voltage amplifying sub-circuit and configured to acquire the amplified output voltage.

According to some possible embodiments of the present disclosure, the voltage follower circuit may include: a source follower transistor having a gate electrode that is the input terminal of the voltage follower circuit, a first electrode that is the output terminal of the voltage follower circuit, and a second electrode connected to a high voltage input terminal; and a current source having a first terminal connected to the output node and a second terminal connected to a low voltage input terminal, and configured to provide a bias current flowing from the output node to the low voltage input terminal.

According to some possible embodiments of the present disclosure, the reset circuit may include a reset transistor having a gate electrode connected to the reset control terminal, a first electrode connected to the reset voltage terminal, and a second electrode connected to the photoelectric node. The photoelectric conversion circuit may include a photodiode having an anode connected to a photoelectric voltage terminal and a cathode connected to the photoelectric node, the photodiode being in a reverse biased state. The selection circuit may include a selection transistor having a gate electrode connected to the selection control terminal, a first electrode connected to the follower node, and a second electrode connected to the output node.

According to some possible embodiments of the present disclosure, the light detecting device may further include one or more light blocking layers configured to prevent the reset transistor, the source follower transistor and the selection transistor from being illuminated.

In a second aspect, the present disclosure provides a light detecting method applied to the light detecting device as described above. The light detecting method includes in a detection cycle:

in a reset period, controlling, by the reset circuit, a connection between the reset voltage terminal and the photoelectric node to be enabled under the control of the reset control terminal; enabling, by the light fluctuation detecting circuit, the connection between the photoelectric node and the input terminal of the voltage follower circuit under the control of the light fluctuation detection control terminal; and controlling, by the selection circuit, a connection between the follower node and the output node to be enabled under the control of the selection control terminal; in a first acquisition period, controlling, by the reset circuit, the connection between the reset voltage terminal and the photoelectric node to be disabled under the control of the reset control terminal; disabling, by the light fluctuation detecting circuit, the connection between the photoelectric node and the input terminal of the voltage follower circuit under the control of the light fluctuation detection control terminal, the voltage at the output terminal of the voltage follower circuit changing as a voltage at the input terminal of the voltage follower circuit changes; and controlling, by the selection circuit, the connection between the follower node and the output node to be enabled under the control of the selection control terminal; in a detection interval period, controlling, by the selection circuit, the connection between the follower node and the output node to be disabled under the control of the selection control terminal; and in a second acquisition period, changing the voltage at the output terminal of the voltage follower circuit as the voltage at the input terminal of the voltage follower circuit changes; and controlling, by the selection circuit, the connection between the follower node and the output node to be enabled under the control the selection control terminal.

According to some possible embodiments of the present disclosure, the light detecting device may further include a photoelectric detection circuit and a light fluctuation determining circuit, and the light detecting method may further include: in the first acquisition period, detecting, by the photoelectric detection circuit, the voltage at the output node, which voltage is a first output voltage; and in the second acquisition period, detecting, by the photoelectric detection circuit, the voltage at the output node, which voltage is a second output voltage, and determining, by the light fluctuation determining circuit, whether there is the fluctuation in the brightness of the light received by the photoelectric conversion circuit based on a voltage difference between the second output voltage and the first output voltage, and outputting, by the light fluctuation determining circuit, a corresponding fluctuation indication signal.

According to some possible embodiments of the present disclosure, the determining, by the light fluctuation determining circuit, whether there is the fluctuation in the brightness of the light received by the photoelectric conversion circuit based on the voltage difference between the second output voltage and the first output voltage, and outputting, by the light fluctuation determining circuit, the corresponding fluctuation indication signal may include: outputting, by the light fluctuation determining circuit, a first fluctuation indication signal when the light fluctuation determining circuit determines that the voltage difference is within a predetermined voltage difference range; or outputting, by the light fluctuation determining circuit, a second fluctuation indication signal when the light fluctuation determining circuit determines that the voltage difference is not within the predetermined voltage difference range.

According to some possible embodiments of the present disclosure, the detection cycle may further include a third acquisition period subsequent to the second acquisition period; and the light detecting device may include an optical signal processing circuit. The light detecting method may further include: in the third acquisition period, enabling, by the light fluctuation detecting circuit, the connection between the photoelectric node and the input terminal of the voltage follower circuit under the light fluctuation detection control terminal, the voltage at the output terminal of the voltage follower circuit changing as the voltage at the input terminal of the voltage follower circuit changes; controlling, by the selection circuit, the connection between the follower node and the output node to be enabled under the control of the selection control terminal; and detecting, by the photoelectric detection circuit, the voltage at the output node, which voltage is a third output voltage; obtaining, by the optical light processing circuit, brightness of corresponding light based on a voltage difference between the third output voltage and the first output voltage when the light fluctuation determining circuit outputs the first fluctuation indication signal; and filtering and weighting, by the optical signal processing circuit, the voltage difference to obtain a weighted voltage difference, and obtaining, by the optical signal processing circuit, the brightness of the corresponding light based on the weighted voltage difference, when the light fluctuation determining circuit outputs the second fluctuation indication signal.

In a third aspect, the present disclosure further provides a display device that includes a light source and the light detecting device as described in the first aspect. The photoelectric conversion circuit included in the light detecting device may be configured to convert a received optical signal into a corresponding electric signal.

BRIEF DESCRIPTION OF THE DRAWINGS

In order to explain the technical solutions of the embodiments of the present disclosure more clearly, the accompanying drawings will be briefly described hereinafter. The drawings described hereinafter illustrate only some of the embodiments of the present disclosure. Based on these drawings and this description, other embodiments can be obtained those skilled in the art without exercising any inventive skill.

DETAILED DESCRIPTION

Figure 1:
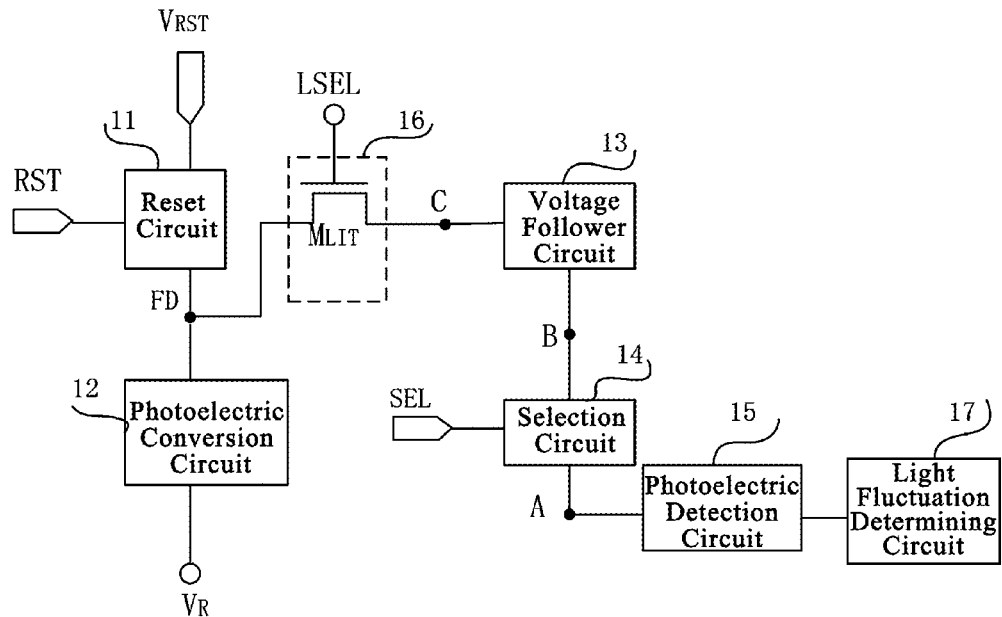
FIG. 1 is a view showing a structure of a light detecting device according to an embodiment of the present disclosure.

The technical solutions in the embodiments of the present disclosure are clearly and completely described hereinafter with reference to the accompanying drawings of the embodiments of the present disclosure. The described embodiments described in detail herein constitute only a part of, rather than all of, the embodiments contemplated in view of the present disclosure. Based on the embodiments of the present disclosure, all the other embodiments obtained by a person having ordinary skill in the art without exercising any inventive skill fall within the protection scope of the present disclosure.

Transistors used in all the embodiments of the present disclosure may all be thin film transistors (TFTs) or field effect transistors (FETs) or other devices having the same characteristics. In the embodiments of the present disclosure, in order to distinguish two electrodes of the transistor except a gate electrode, one of the two electrodes may be referred to as a first electrode, and the other one may be referred to as a second electrode. In practical, the first electrode may be a drain electrode, and the second electrode may be a source electrode. Alternatively, the first electrode may be a source electrode, and the second electrode may be a drain electrode.

A light detecting device according to some embodiments of the present disclosure includes: a reset circuit connected to a reset control terminal, a reset voltage terminal and a photoelectric node; a photoelectric conversion circuit connected to the photoelectric node and configured to convert a received optical signal that is output by a light source into a corresponding electrical signal; a voltage follower circuit; a selection circuit connected to a selection control terminal, a follower node and an output node; and a light fluctuation detecting circuit connected to each of a light fluctuation detection control terminal, the photoelectric node and an input terminal of the voltage follower circuit. An output terminal of the voltage follower circuit is connected to the follower node. The light fluctuation detecting circuit is configured to enable or disable a connection between the photoelectric node and the input terminal of the voltage follower circuit under the control of the light fluctuation detection control terminal; and when the light fluctuation detecting circuit is turned off, a drain current flowing through the light fluctuation detecting circuit changes as brightness of light received by the light fluctuation detecting circuit changes. A voltage at the output node is used to determine brightness of light received by the photoelectric conversion circuit and to determine whether there is a fluctuation in the brightness of the light received by the photoelectric conversion circuit.

Since the light fluctuation detecting circuit is added to the light detecting device according to the embodiments of the present disclosure, and when being exposed to light, the light fluctuation detecting circuit exhibits varying drain currents (when the light fluctuation detecting circuit includes a light fluctuation detecting transistor, a drain current of the light fluctuation detecting transistor changes as brightness of its received light changes), a voltage at the output node changes, and whether there is a great fluctuation in brightness of light outputted by the light source may be detected based on the voltage at the output node.

Specifically, the light detecting device according to the embodiments of the present disclosure may further include: a photoelectric detection circuit connected to the output node and configured to detect the voltage at the output node; and a light fluctuation determining circuit connected to the photoelectric detection circuit and configured to determine whether there is the fluctuation in the brightness of the light received by the photoelectric conversion circuit based on the voltage at the output node.

According to the light detecting device of the embodiments of the present disclosure, the voltage at the output node is detected by the photoelectric detection circuit, and the light fluctuation determining circuit can detect whether there is the great fluctuation in the brightness of the light received by the photoelectric conversion circuit based on the voltage at the output node.

In practical, the light fluctuation detecting circuit may include a light fluctuation detecting transistor. A gate electrode of the light fluctuation detecting transistor is a control terminal of the light fluctuation detecting circuit, a first electrode of the light fluctuation detecting transistor is connected to the input terminal of the voltage follower circuit, a second electrode of the light fluctuation detecting transistor is connected to the photoelectric node, and a drain current of the light fluctuation detecting transistor changes as brightness of light received by the light fluctuation detecting transistor changes.

In practical, a threshold voltage of the light fluctuation detecting transistor also changes as the brightness of the light received by the light fluctuation detecting transistor changes.

In a specific implementation, no light blocking layer is provided between the light fluctuation detecting transistor and the light source.

Since there is no light blocking layer between the light fluctuation detecting transistor and the light source, a drain current and a threshold voltage of the light fluctuation detecting transistor may change with the brightness of the light received by the light fluctuation detecting transistor.

In general, when the light fluctuation detecting transistor is an N-type transistor, and the brightness of the light received by the light fluctuation detecting transistor increases, the drain current of the light fluctuation detecting transistor also increases. Furthermore, when the brightness of the light received by the light fluctuation detecting transistor decreases, the drain current of the light received by the light fluctuation detecting transistor also decreases.

In practical, when the light fluctuation detecting transistor is a P-type transistor, and the brightness of the light received by the light fluctuation detecting transistor increases, the drain current of the light fluctuation detecting transistor also increases. Furthermore, when the brightness of the light received by the light fluctuation detecting transistor decreases, the drain current of the light received by the light fluctuation detecting transistor also decreases.

In the following embodiments of the present disclosure, explanation will be given by taking an N-type transistor as an example of the light fluctuation detecting transistor. However, in practical, the light fluctuation detecting transistor may be a P-type transistor, and the type of the light fluctuation detecting transistor will not be limited herein.

The light fluctuation determining circuit is further configured to output a corresponding fluctuation indication signal based on a result of the determination of whether there is the fluctuation in the brightness of the light received by the photoelectric conversion circuit. The light detecting device further includes an optical signal processing circuit connected to the light fluctuation determining circuit and the photoelectric detection circuit, and configured to process the voltage at the output node detected by the photoelectric detection circuit based on the fluctuation indication signal and to obtain brightness of corresponding light based on a voltage obtained after the processing.

According to some embodiments of the present disclosure, the photoelectric detection circuit may include a voltage acquiring sub-circuit connected to the output node and configured to acquire an output voltage that is the voltage at the output node.

Alternatively, according to some other embodiments of the present disclosure, the photoelectric detection circuit may include: a voltage amplifying sub-circuit connected to the output node and configured to amplify the voltage at the output node to obtain an amplified output voltage; and a voltage acquiring sub-circuit connected to the voltage amplifying sub-circuit and configured to acquire the amplified output voltage.

In practical, the photoelectric detection circuit may only include a voltage acquiring sub-circuit that may acquire the voltage at the output node directly. Alternatively, the photoelectric detection circuit may also include both a voltage amplifying sub-circuit and a voltage acquiring sub-circuit. In the latter case, the voltage at the output node is first amplified by a voltage amplifying sub-circuit to obtain an amplified output voltage, and the amplified output voltage is then acquired by the voltage acquiring sub-circuit.

According to some embodiments of the present disclosure, the voltage follower circuit may include: a source follower transistor having a gate electrode that is the input terminal of the voltage follower circuit, a first electrode that is the output terminal of the voltage follower circuit, and a second electrode connected to a high voltage input terminal; and a current source having a first terminal connected to the output node and a second terminal connected to a low voltage input terminal, and configured to provide a bias current flowing from the output node to the low voltage input terminal.

According to some embodiments of the present disclosure, the reset circuit may include a reset transistor having a gate electrode connected to the reset control terminal, a first electrode connected to the reset voltage terminal, and a second electrode connected to the photoelectric node.

According to some embodiments of the present disclosure, the photoelectric conversion circuit may include a photodiode having an anode connected to a photoelectric voltage terminal and a cathode connected to the photoelectric node, and the photodiode is in a reverse biased state.

According to some embodiments of the present disclosure, the selection circuit may include a selection transistor having a gate electrode connected to the selection control terminal, a first electrode connected to the follower node, and a second electrode connected to the output node.

In practical, the light detecting device may further include one or more light blocking layers configured to prevent the reset transistor, the source follower transistor and the selection transistor from being illuminated.

In specific implementations, a first light blocking layer may be provided between the reset transistor and the light source to prevent a drain current and a threshold voltage of the reset transistor from being affected by brightness of light received by the reset transistor.

A second light blocking layer may be provided between the source follower transistor and the light source to prevent a drain current and a threshold voltage of the source follower transistor from being affected by the brightness of the light received by the source follower transistor.

A third light blocking layer may be provided between the selection transistor and the light source to prevent a drain current and a threshold voltage at the selection transistor from being affected by brightness of light received by the selection transistor.

Specifically, as shown in FIG. 1, the light detecting device according to the embodiments of the present disclosure includes a reset circuit 11, a photoelectric conversion circuit 12, a voltage follower circuit 13, a selection circuit 14, a photoelectric detection circuit 15, a light fluctuation detecting circuit 16 and a light fluctuation determining circuit 17.

The reset circuit 11 is connected to a reset control terminal RST, a reset voltage terminal and a photoelectric node FD. The reset voltage terminal is configured to input a reset voltage $V_{RST}$ and to control a connection or disconnection between the photoelectric node FD and the reset voltage terminal under the control of the reset control terminal RST.

The photoelectric conversion circuit 12 is connected to the photoelectric node FD and configured to convert a received optical signal that is outputted by a light source (not shown in FIG. 1) into an electrical signal.

The selection circuit 14 is connected to a selection control terminal SEL, a follower node B and an output node A, and configured to control a connection or disconnection between the output node A and the follower node B under the control of the selection control terminal SEL.

The photoelectric detection circuit 15 is connected to the output node A and configured to detect a voltage at the output node A.

The light fluctuation detecting circuit 16 includes a light fluctuation detecting transistor $M_{LIT}$.

Specifically, a gate electrode of the light fluctuation detecting transistor $M_{LIT}$ is connected to a light fluctuation detection control terminal LSEL, a first electrode of the light fluctuation detecting transistor $M_{LIT}$ is connected to an input terminal of the voltage follower circuit 13 (in FIG. 1, the input terminal of the voltage follower circuit 13 is connected to a first node C), and a second electrode of the light fluctuation detecting transistor $M_{LIT}$ is connected to the photoelectric node FD. An output terminal of the voltage follower circuit 13 is connected to the follower node B.

A voltage at the output terminal of the voltage follower circuit 13 changes as a voltage at the input terminal of the voltage follower circuit 13 changes, that is, an amount of change in the voltage at the follower node B is equal to a product of an amount of change in the voltage at the input terminal of the voltage follower circuit 13 and a follower coefficient sg of the voltage follower circuit 13. A value of the follower coefficient sg is related to a specific structure of the voltage follower circuit 13, and a formula of the follower coefficient sg will be described in the following specific embodiments.

The light fluctuation determining circuit 17 is connected to the photoelectric detection circuit 15, and configured to determine whether there is a fluctuation in brightness of light received by the photoelectric conversion circuit based on the voltage at output node A.

In the embodiment shown in FIG. 1, the $M_{LIT}$ is an N-type transistor, and is not limited thereto. In practical, the light source may be a backlight source, or may be an ambient light source.

In specific implementations, the light fluctuation determining circuit 17 may be further configured to output a corresponding fluctuation indication signal based on a result of the determination of whether there is the fluctuation in the brightness of the light received by the photoelectric conversion circuit 17.

Figure 2:
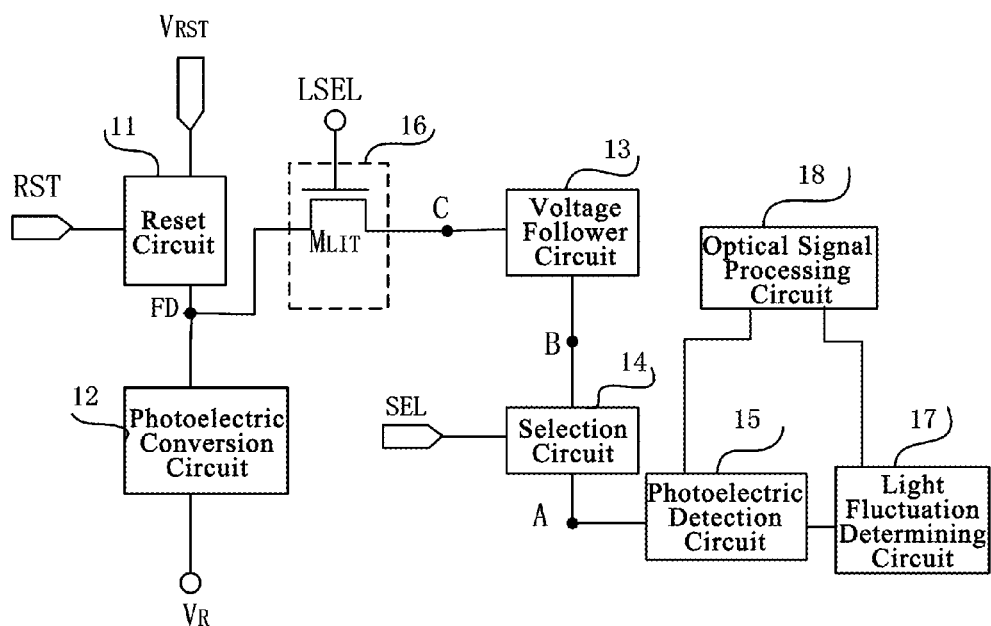
FIG. 2 is a view showing a light detecting device according to another embodiment of the present disclosure.

As shown in FIG. 2, on the basis of the embodiment of the light detecting device shown in FIG. 1, the light detecting device may further include an optical signal processing circuit 18 connected to the light fluctuation determining circuit 17 and the photoelectric detection circuit 15, and configured to process the voltage at the output node A detected by the photoelectric detection circuit 15 based on the fluctuation indication signal and to obtain brightness of corresponding light based on a voltage obtained after the processing.

In practical, the light detecting device may further include the optical signal processing circuit 18 for obtaining brightness of actual light, i.e., with removal of light fluctuation noise, outputted from the light source based on a result of the determination of light fluctuation by the light fluctuation determining circuit 17.

Figure 3:
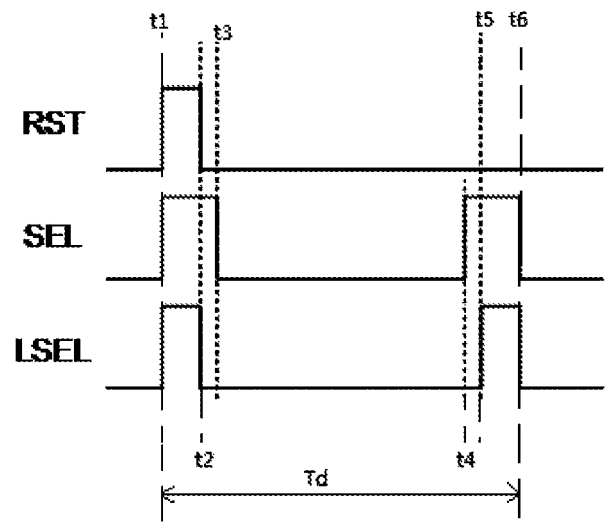
FIG. 3 is an operation timing sequence of the embodiments of the light detecting devices as shown in FIGS. 2 and 4 of the present disclosure.

As shown in FIG. 3, when the light detecting device shown in FIG. 2 of the present disclosure operates, the following processing is performed in a detection cycle.

In a reset period (from a first timing t1 to a second timing t2), the reset circuit 11 controls a connection between the reset voltage terminal and the photoelectric node FD to be enabled under the control of the reset control terminal RST; the light fluctuation detecting transistor $M_{LIT}$ included in the light fluctuation detecting circuit 16 is turned on, so as to control a connection between a first electrode and a second electrode of the light fluctuation detecting transistor $M_{LIT}$ to be enabled under the control of the light fluctuation detection control terminal LSET; and the selection circuit 14 controls a connection between the follower node B and the output node A to be enabled under the control of the selection control terminal SEL. At this time, the voltage at the FD and the voltage at the input terminal of the voltage follower circuit 13 are reset to $V_{RST}$.

In a first acquiring period (from the second timing t2 to a third timing t3), the reset circuit 11 controls the connection between the reset voltage terminal and the photoelectric node FD to be disabled under the control of the reset control terminal RST; the light fluctuation detecting transistor $M_{LIT}$ included in the light fluctuation detecting circuit 16 is turned off, so as to control the connection between the first electrode and the second electrode of the light fluctuation detecting transistor $M_{LIT}$ to be disabled under the control of the light fluctuation detection control terminal LSET. At this time, a change in the voltage at the output terminal of the voltage follower circuit 13 (i.e., the voltage at the follower node B) follows a change in the voltage at the output terminal of the voltage follower circuit 13 (an amount of change in the voltage at the follower node B is equal to a product of an amount of change in the voltage at the input terminal of the voltage follower circuit and a follower coefficient sg; a value of the follower coefficient sg is related to a specific structure of the voltage follower circuit 13, and a formula of the follower coefficient sg will be described in the following embodiments). The selection circuit 14 controls the connection between the follower node B and the output node A to be enabled under the control of the selection control terminal SEL. At this time, the voltage at the output node A is equal to the voltage at the follower node B, and the voltage at the output node A detected by the photoelectric detection circuit 15 at any time during the first acquisition period is a first output voltage Vout1.

In a detection interval period (from the third timing t3 to a fourth timing t4), the reset circuit 11 controls the connection between the reset voltage terminal and the photoelectric node FD to be disabled under the control of the reset control node RST, and the selection circuit 14 controls the connection between the follower node B and the output node A to be disabled under the control of the selection control terminal SEL. At this time, the photoelectric conversion circuit 12 performs electric charge integration of an electrical signal converted from the optical signal at the photoelectric node FD, and the LEST controls the $M_{LIT}$ to be turned off. At this time, electric charges integrated at the photoelectric node FD cannot be transferred to the input terminal of the voltage follower circuit 13, and only a drain current of the $M_{LIT}$ flows to the input terminal of the voltage follower circuit 13 and is integrated there, and the drain current of the $M_{LIT}$ changes with the change in the brightness of its received light. Assuming that the $M_{LIT}$ has a fixed drain current when the light currently received by the $M_{LIT}$ presents stable brightness, the voltage at the input terminal of the voltage follower circuit 13 after a predetermined timing t0 should be within a predetermined voltage range. However, if the brightness of the current light has a fluctuation, the voltage at the input terminal of the voltage follower circuit 13 after the predetermined timing t0 will not be within the predetermined voltage range. Assuming that the value of the drain current of the $M_{LIT}$ is in a range of greater than I1 and less than I2 (I1 is a first current value, I2 is a second current value, and T1 is less than I2) when the light received by the $M_{LIT}$ presents the stable brightness, the predetermined voltage range in the embodiment of the light detecting device shown in FIG. 2 may be greater than $(V_{RST}-t0\times I2/Cc)$ and less than $(V_{RST}-t0\times I1/Cc)$, where t0 is the duration of the detection interval period, and Cc is an equivalent capacitance value of the first node C.

In a second acquisition period (from the fourth timing t4 to a fifth timing t5), a change in the voltage at the output terminal of the voltage follower circuit 13 (i.e., a change in the voltage at the follower node B) follows a change in the voltage at the input terminal of the voltage follower circuit 13 (an amount of change in the voltage at the follower node B is equal to a product of an amount of change in the voltage at the input terminal of the voltage follower circuit 13 and a follower coefficient sg. A value of the follower coefficient sg is related to a specific structure of the voltage follower circuit 13, and a formula of the follower coefficient sg will be described in the following embodiment. In general, by setting transconductance of the source follower transistor included in the voltage follower circuit 13 and an equivalent resistance value of the current source included in the voltage follower circuit, the value of the follower coefficient sg may be approximated to 1, so that the amount of change in the voltage at the output terminal of the voltage follower circuit 13 is almost equal to the amount of change in the voltage at the input terminal of the voltage follower circuit 13). The selection circuit 14 controls the connection between the follower node B and the output node A to be enabled under the control of the selection control terminal SEL. A voltage at the output node A detected by the photoelectric detection circuit 15 at any time during the second acquisition period is a second output voltage Vout2. The light fluctuation determining circuit determines whether there is a fluctuation in the brightness of light received by the photoelectric conversion circuit based on a voltage difference between the second output voltage Vout2 and the first output voltage Vout1, and outputs a corresponding fluctuation indication signal. When the light fluctuation determining circuit 17 determines that the voltage difference is within a predetermined voltage difference range, the light fluctuation determining circuit outputs a first fluctuation indication signal that indicates that there is no excessive fluctuation in the brightness of the light emitted from the light source. Additionally, when the light fluctuation determining circuit 17 determines that the voltage difference is not within the predetermined voltage difference range, the light fluctuation determining circuit 17 outputs a second fluctuation indication signal that indicates there is an excessive fluctuation in the brightness of the light emitted from the light source. In the embodiment of the light detecting device shown in FIG. 2, the predetermined voltage difference range may be greater than $-t0 \times I2/Cc$ and less than $-t0 \times I1/Cc$, where t0 is the duration of the detection interval period, I1 is a first current value, I2 is a second current value, and Cc is an equivalent capacitance value at the first node C.

In a third acquisition period (from the fifth timing t5 to a sixth timing t6), the light fluctuation detecting transistor $M_{LIT}$ included in the light fluctuation detecting circuit 16 is turned on, so as to control the connection between the first electrode and the second electrode of the light fluctuation detecting transistor $M_{LIT}$ to be enabled under the control of the light fluctuation detection control terminal LSET. At this time, the voltage at the output terminal of the voltage follower circuit 13 (i.e., the voltage at the follower node B) changes as the voltage at the input terminal of the voltage follower circuit 13 changes (i.e., an amount of change in the voltage at the follower node B is equal to a product of an amount of change in the voltage at the input terminal of the voltage follower circuit 13 and a follower coefficient sg. A value of the follower coefficient sg is related to a specific structure of the voltage follower circuit 13, and a formula of the follower coefficient sg will be described in the following embodiment. In general, by setting transconductance of the source follower transistor included in the voltage follower circuit 13 and an equivalent resistance value of the current source included in the voltage follower circuit, the value of the follower coefficient sg may be approximated to 1, so that the amount of change in the voltage at the output terminal of the voltage follower circuit 13 is almost equal to the amount of change in the voltage at the input terminal of the voltage follower circuit 13). The selection circuit 14 controls the connection between the follower node B and the output node A to be enabled under the control of the selection control terminal SEL, and the photoelectric detection circuit 15 detects the voltage at the output node A at any time in the third acquisition period, which voltage is a third output voltage Vout3. When the light fluctuation determining circuit 17 outputs the first fluctuation indication signal, it means that there is no excessive fluctuation in the brightness of the light emitted from the light source, and the optical signal processing circuit 18 may obtain brightness of the corresponding light directly based on a voltage difference between the third output voltage Vout3 and the first output voltage Vout1. Additionally, when the light fluctuation determining circuit outputs the second fluctuation indication signal, it means that there is an excessive fluctuation in the brightness of the light emitted from the light source, and the optical signal processing circuit 18 performs filtering and weighting on the voltage difference to obtain a weighted voltage difference, and obtains brightness of the corresponding light based on the weighted voltage difference. Specifically, the optical signal processing circuit 18 may determine whether to initiate the filtering and weighting based on the voltage difference between the Vout2 and the Vout1.

The light detecting device according to the embodiments of the present disclosure can be used in the following application: when it has been detected that a finger touches the light detecting device (since the duration of one detection cycle, i.e., Td shown in FIG. 3, is very short, a period of time from detecting a finger touch to detecting a fingerprint and then to determining valleys and ridges will last for several detection cycles), that is, when the brightness of the light received by the photoelectric conversion circuit 12 is much lower than the brightness of the light received by the photoelectric conversion circuit 12 when no finger touches the light detecting device, in the case that the presence of touch has been determined, it is further necessary to perform fingerprint recognition. Since the fingerprint recognition requires the determination of valleys and ridges, but the difference between the brightness of light corresponding to the valley and the brightness of light corresponding to the ridge is relatively small, if there is a fluctuation of the backlight source at this time, it will significantly affect the determination of the valleys and ridges of the fingerprint. In this case, when it has been known that the light detecting device is covered by the finger, the brightness of the light received by the light fluctuation detecting transistor $M_{LIT}$ included in the light detecting device may be obtained in the case of assuming that there is no fluctuation in the brightness of the light received by the photoelectric conversion circuit, and the magnitude of the drain current of the $M_{LIT}$ under the same assumption may be obtained as well.

Figure 4:
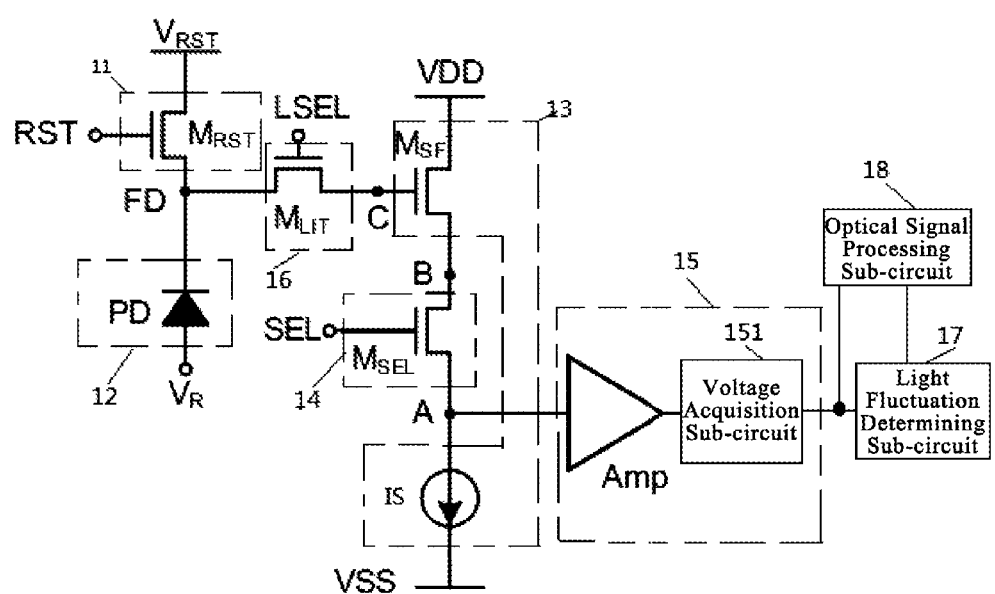
FIG. 4 is a circuit diagram of a specific embodiment of a light detecting device of the present disclosure.

On the basis of the embodiment of the light detecting device shown in FIG. 2 of the present disclosure, in a specific embodiment of the light detecting device as shown in FIG. 4, the reset circuit 11 includes a reset transistor $M_{RST}$ that has a gate electrode connected to the reset control terminal RST, a first electrode connected to the reset voltage terminal and a second electrode connected to the photoelectric node FD. The reset voltage terminal is used to input a reset voltage $V_{RST}$.

The photoelectric conversion circuit 12 includes a photodiode PD having an anode connected to a photoelectric voltage terminal and a cathode connected to the photoelectric node FD. The photodiode PD is in a reverse biased state. The photoelectric voltage terminal is used to input a photoelectric voltage $V_R$.

The voltage follower circuit 13 includes a source follower transistor $M_{SF}$ and a current source IS.

A gate electrode of the source follower transistor $M_{SF}$ is the input terminal of the voltage follower circuit 13.

A first electrode of the source follower transistor $M_{SF}$ is the output terminal of the voltage follower circuit 13 (in practical, the first electrode of the $M_{SF}$ may be a source electrode of the $M_{SF}$, and the $M_{SF}$ is required to operate in a saturation region in order to achieve that the voltage at the source electrode changes with the change in the voltage at the gate electrode).

A second electrode of the source follower transistor $M_{SF}$ is connected to a high voltage input terminal, and in this embodiment, the high voltage input terminal is used to input a high voltage VDD.

A first terminal of the current source IS is connected to the output node A, and a second terminal of the current source IS is connected to a low voltage input terminal, and the current source IS is configured to provide a bias current flowing from the output node A to the low voltage input terminal. The bias current is used for use in the operation of the source follower transistor $M_{SF}$; and the low voltage input terminal is used to input a low voltage VSS.

The selection circuit 14 includes a selection transistor $M_{SEL}$ having a gate electrode connected to the selection control terminal SEL, a first electrode connected to the follower node B, and a second electrode connected to the output node A.

The photoelectric detection circuit 15 includes a voltage amplifier Amp and a voltage acquisition sub-circuit 151.

An input terminal of the voltage amplifier Amp is connected to the output node A.

The voltage amplifier Amp is configured to amplify the voltage at the output node A so as to obtain an amplified output voltage.

The voltage acquisition sub-circuit 151 is connected to an output terminal of the voltage amplifier Amp, and configured to acquire the amplified output voltage.

In the specific embodiment of the light detecting device shown in FIG. 4, an amplification factor of the voltage amplifier Amp is, for example, Ua.

In the specific embodiment of the light detecting device shown in FIG. 4, when the $M_{SF}$ is in a saturation state, $$\Delta Vs = (gm \times Ro) \times \Delta Vg / (1 + gm \times Ro) \quad \text{(Formula 1)}$$

where Ro is an equivalent resistance value of the current source IS, gm is transconductance of the source follower transistor $M_{SF}$, $\Delta Vs$ is an amount of change in the voltage at the output terminal of the voltage follower circuit 13 (i.e., an amount of change in the voltage at the first electrode of the $M_{SF}$), and $\Delta Vg$ is an amount of change in the voltage at the input terminal of the voltage follower circuit 13. Moreover, when gm×Ro is big enough, $\Delta Vs$ is almost equal to $\Delta Vg$. As can be seen from the above formula 1, the follower coefficient sg of the voltage follower circuit 13 is equal to (gm×Ro)/(1+gm×Ro).

In the specific embodiment of the light detecting device shown in FIG. 4, gm and Ro are set to be large enough so that sg is approximately equal to 1.

In the specific embodiment of the light detecting device shown in FIG. 4, all the transistors are N-type transistors, but are not limited thereto. In practical, the above transistors may also be replaced by P-type transistors.

In the specific embodiment of the light detecting device shown in FIG. 4, a first light blocking layer (not shown) is provided between the $M_{RST}$ and the light source so that a drain current of the $M_{RST}$ will not be affected by brightness of light received by the $M_{SEL}$. A second light blocking layer (not shown) is provided between the $M_{SF}$ and the light source so that a drain current of the $M_{SF}$ will not be affected by the brightness of the light received by the $M_{SEL}$. Furthermore, a third light blocking layer (not shown) is provided between the $M_{SEL}$ and the light source so that a drain current of the $M_{SEL}$ will not be affected by the brightness of the light received by the $M_{SEL}$.

As shown in FIG. 3, when the specific embodiment of the light detecting device shown in FIG. 4 of the present disclosure operates, the following processing is performed.

In the reset period (from the first timing t1 to the second timing t2), the RST outputs a high level, the SEL outputs a high level, the LSEL outputs a high level, and the $M_{RST}$ is turned on to control the connection between the reset voltage terminal and the photoelectric node FD to be enabled; the light fluctuation detecting transistor $M_{LIT}$ included in the light fluctuation detecting circuit 16 is turned on; and the $M_{SEL}$ is turned on to reset each of the voltage at the FD and the voltage at the input terminal of the voltage follower circuit 13 (i.e., the voltage at the gate electrode of the $M_{SF}$) to $V_{RST}$, so that the $M_{SF}$ is in a saturation state.

In the first acquiring period (from the second timing t2 to the third timing t3), the RST outputs a low level, the SEL outputs a high level, the LSEL outputs a low level, the $M_{RST}$ is turned off, so as to control the connection between the reset voltage terminal and the photoelectric node PD to be disabled; the light fluctuation detecting transistor $M_{LIT}$ included in the light fluctuation detecting circuit 16 is turned off, so as to control the connection between the photoelectric node FD and the input terminal of the voltage follower circuit 13 to be disabled, so that the voltage at the follower node B changes with the change in the voltage at the input terminal of the voltage follower circuit 13; and the $M_{SEL}$ is turned on so as to enable the connection between the follower node B and the output node A, and the voltage at the output node A is thus equal to the voltage at the follower node B. At any time within the first acquisition period, the voltage amplifier Amp amplifies the voltage at the output node A to obtain a first amplified output voltage Vaout1, and the voltage amplifying sub-circuit 151 acquires the first amplified output voltage Vaout1.

In the detection interval period (from the third timing t3 to the fourth timing t4), the RST outputs a low level, the SEL outputs a low level, the LSEL outputs a low level, and the $M_{RST}$ is turned off to disable the connection between the reset voltage terminal and the photoelectric node FD; and the $M_{SEL}$ is turned off to disable the connection between the follower node B and the output node A. At this time, the photoelectric conversion circuit 12 performs electric charge integration of the electrical signal converted from the optical signal at the photoelectric node FD, and the LEST controls the $M_{LIT}$ to be turned off. At this time, electric charges integrated at the photoelectric node FD cannot be transferred to the input terminal of the voltage follower circuit 13, and only a drain current of the $M_{LIT}$ flows to the input terminal of the voltage follower circuit 13 and is integrated there, and the drain current of the $M_{LIT}$ changes with the change in the brightness of its received light. Assuming that the $M_{LIT}$ has a fixed drain current when the current light presents stable brightness, the voltage at the input terminal of the voltage follower circuit 13 after a predetermined timing t0 should be within a predetermined voltage range. However, if the brightness of the current light has a fluctuation, the voltage at the input terminal of the voltage follower circuit 13 after the predetermined timing t0 will not be within the predetermined voltage range. Assuming that the value of the drain current of the $M_{LIT}$ is in the range of greater than I1 and less than I2 (I1 is the first current value, I2 is the second current value, and T1 is less than I2) when the light received by the $M_{LIT}$ presents the stable brightness, the predetermined voltage range in the specific embodiment of the light detecting device shown in FIG. 4 may be greater than $(V_{RST} - t0 \times I2 / Cc)$ and less than $(V_{RST} - t0 \times I1 / Cc)$, where Cc is an equivalent capacitance value of the first node C.

In the second acquisition period (from the fourth timing t4 to the fifth timing t5), the RST outputs a low level, the SEL outputs a high level, the LSEL outputs a low level, the $M_{RST}$ is turned off, the $M_{SEL}$ is turned on, and the $M_{LIT}$ is turned off so that a change in the voltage at the follower node B follows a change in the voltage at the input terminal of the voltage follower circuit 13 (an amount of change in the voltage at the follower node B is equal to a product of an amount of change in the voltage at the input terminal of the voltage follower circuit 13 and a follower coefficient sg); and the $M_{SEL}$ is turned on to enable the connection between the follower node B and the output node A. At any time within the second acquisition period, the voltage amplifier Amp amplifies the voltage at the output node A to obtain a second amplified output voltage Vout2, and the voltage acquisition sub-circuit 151 acquires the second amplified output voltage Vaout2. The light fluctuation determining circuit 17 determines whether there is a fluctuation in the brightness of light received by the photoelectric conversion circuit based on a voltage difference between the second output voltage Vaout2 and the first output voltage Vaout1, and outputs a corresponding fluctuation indication signal. When the light fluctuation determining circuit 17 determines that the voltage difference is within a predetermined voltage difference range, the light fluctuation determining circuit 17 outputs the first fluctuation indication signal that indicates that there is no excessive fluctuation in the brightness of the light emitted from the light source. Additionally, when the light fluctuation determining circuit 17 determines that the voltage difference is not within the predetermined voltage difference range, the light fluctuation determining circuit 17 outputs the second fluctuation indication signal that indicates there is an excessive fluctuation in the brightness of the light emitted from the light source. In the specific embodiment of the light detecting device shown in FIG. 4, the predetermined voltage difference range may be greater than Uax−t0×I2/Cc and less than Uax−t0×I1/Cc, where t0 is the duration of the detection interval period, I1 is a first current value, I2 is a second current value, Ua is the amplifying factor of the voltage amplifier Amp, and Cc is an equivalent capacitance value at the first node C.

In the third acquisition period (from the fifth timing t5 to the sixth timing t6), the RST outputs a low level, the SEL outputs a high level, the LSEL outputs a high level, and the $M_{LIT}$ is turned on so as to enable the connection between the photoelectric node FD and the input terminal of the voltage follower circuit 13. At this time, a change in the voltage at the follower node B follows a change in the voltage at the input terminal of the voltage follower circuit 13 (i.e., an amount of change in the voltage at the follower node B is equal to a product of an amount of change in the voltage at the input terminal of the voltage follower circuit and a follower coefficient sg. A value of the follower coefficient sg is related to a specific structure of the voltage follower circuit 13, and a formula of the follower coefficient sg will be described in the following embodiment. In general, by setting transconductance of the source follower transistor included in the voltage follower circuit 13 and an equivalent resistance value of the current source included in the voltage follower circuit, the value of the follower coefficient sg may be approximated to 1, so that the amount of change in the voltage at the output terminal of the voltage follower circuit 13 is almost equal to the amount of change in the voltage at the input terminal of the voltage follower circuit 13); and the $M_{SEL}$ is turned on to enable the connection between the follower node B and the output node A. At any time within the third acquisition period, the voltage amplifier Amp amplifies the voltage at the output node A to obtain a third amplified output voltage Vaout3, and the voltage acquisition sub-circuit 151 acquires the third amplified output voltage Vaout3. When the light fluctuation determining circuit 17 outputs the first fluctuation indication signal, it means that there is no excessive fluctuation in the brightness of the light emitted from the light source, and the optical signal processing circuit 18 may obtain brightness of the corresponding light directly based on a voltage difference between the third amplified output voltage Vaout3 and the first amplified output voltage Vaout1. Additionally, when the light fluctuation determining circuit outputs the second fluctuation indication signal, it means that there is an excessive fluctuation in the brightness of the light emitted from the light source, and the optical signal processing circuit 18 performs filtering and weighting on the voltage difference to obtain a weighted voltage difference, and obtains brightness of the corresponding light based on the weighted voltage difference, so as to achieve the effect of reducing the possibility of acquiring error optical signals. Specifically, the optical signal processing circuit 18 may determine whether to initiate the filtering and weighting based on the voltage difference between the Vaout2 and the Vaout1.

The light detecting method as described in the above embodiments of present disclosure is applied to the light detecting device as described above. The light detecting method includes in a detection cycle:

in a reset period, controlling, by the reset circuit, a connection between the reset voltage terminal and the photoelectric node to be enabled under the control of the reset control terminal; enabling, by the light fluctuation detecting circuit, the connection between the photoelectric node and the input terminal of the voltage follower circuit under the control of the light fluctuation detection control terminal; and controlling, by the selection circuit, a connection between the follower node and the output node to be enabled under the control of the selection control terminal;

in a first acquisition period, controlling, by the reset circuit, the connection between the reset voltage terminal and the photoelectric node to be disabled under the control of the reset control terminal; disabling, by the light fluctuation detecting circuit, the connection between the photoelectric node and the input terminal of the voltage follower circuit under the control of the light fluctuation detection control terminal, the voltage at the output terminal of the voltage follower circuit changing as a voltage at the input terminal of the voltage follower circuit changes; and controlling, by the selection circuit, the connection between the follower node and the output node to be enabled under the control of the selection control terminal;

in a detection interval period, controlling, by the selection circuit, the connection between the follower node and the output node to be disabled under the control of the selection control terminal; and in a second acquisition period, changing the voltage at the output terminal of the voltage follower circuit as the voltage at the input terminal of the voltage follower circuit changes; and controlling, by the selection circuit, the connection between the follower node and the output node to be enabled under the control the selection control terminal.

The light detecting method according to the embodiment of the present disclosure determines whether there is a fluctuation in the brightness of light received by the photoelectric conversion circuit based on a characteristic in which when the light fluctuation detecting circuit is exposed to light, its drain current will change (when the light fluctuation detecting circuit includes a light fluctuation detecting transistor, the drain current of the light fluctuation detecting transistor changes as the brightness of its received light changes). Moreover, the change in the drain current will cause a change in the voltage at the output node, thereby making it possible to determine whether there is a great fluctuation in the brightness of light output from the light source based on the voltage at the output node.

Specifically, when the light detecting device further includes a photoelectric detection circuit and a light fluctuation determining circuit, the light detecting method further includes:

in the first acquisition period, detecting, by the photoelectric detection circuit, the voltage at the output node, which voltage is a first output voltage; and in the second acquisition period, detecting, by the photoelectric detection circuit, the voltage at the output node, which voltage is a second output voltage, and determining, by the light fluctuation determining circuit, whether there is the fluctuation in the brightness of the light received by the photoelectric conversion circuit based on a voltage difference between the second output voltage and the first output voltage, and outputting, by the light fluctuation determining circuit, a corresponding fluctuation indication signal.

According to the light detecting method of the embodiments of the present disclosure, the photoelectric detection circuit detects the voltage at the output node, and the light fluctuation determining circuit may determine whether there is a great fluctuation in the brightness of the light received by the photoelectric conversion circuit based on the voltage at the output node.

In an implementation, the determining, by the light fluctuation determining circuit, whether there is the fluctuation in the brightness of the light received by the photoelectric conversion circuit based on the voltage difference between the second output voltage and the first output voltage, and outputting, by the light fluctuation determining circuit, the corresponding fluctuation indication signal includes:

outputting, by the light fluctuation determining circuit, a first fluctuation indication signal when the light fluctuation determining circuit determines that the voltage difference is within a predetermined voltage difference range; or outputting, by the light fluctuation determining circuit, a second fluctuation indication signal when the light fluctuation determining circuit determines that the voltage difference is not within the predetermined voltage difference range.

In implementations, the detection cycle further includes a third acquisition period subsequent to the second acquisition period, and the light detecting device includes an optical signal processing circuit. The light detecting device thus further includes:

in the third acquisition period, enabling, by the light fluctuation detecting circuit, the connection between the photoelectric node and the input terminal of the voltage follower circuit under the light fluctuation detection control terminal, the voltage at the output terminal of the voltage follower circuit changing as the voltage at the input terminal of the voltage follower circuit changes; controlling, by the selection circuit, the connection between the follower node and the output node to be enabled under the control of the selection control terminal; and detecting, by the photoelectric detection circuit, the voltage at the output node, which voltage is a third output voltage;

obtaining, by the optical light processing circuit, brightness of corresponding light based on a voltage difference between the third output voltage and the first output voltage when the light fluctuation determining circuit outputs the first fluctuation indication signal; and filtering and weighting, by the optical signal processing circuit, the voltage difference to obtain a weighted voltage difference, and obtaining, by the optical signal processing circuit, the brightness of the corresponding light based on the weighted voltage difference, when the light fluctuation determining circuit outputs the second fluctuation indication signal.

In addition, a display device according to some embodiments of the present disclosure includes a light source and the light detecting device as described above. The photoelectric detection circuit included in the light detecting device is configured to convert a received optical signal into a corresponding electric signal.

The display device provided in the embodiments of the present disclosure may be any product or component having a display function, such as a mobile phone, a tablet computer, a television, a display, a notebook computer, a digital photo frame, a navigator, or the like.

The above are alternative embodiments of the present disclosure, and it should be indicated that those skilled in the art can also make several improvements and modifications without departing from the principles of the present disclosure. Such improvements and modifications should also be considered as falling within the scope of protection of the present disclosure.

The invention claimed is:

1. A light detecting device comprising:
   a reset circuit connected to a reset control terminal, a reset voltage terminal, and a photoelectric node;
   a photoelectric conversion circuit connected to the photoelectric node, and configured to convert a received optical signal into a corresponding electrical signal, the optical signal being output by a light source;
   a voltage follower circuit;
   a selection circuit connected to a selection control terminal, a follower node, and an output node; and
   a light fluctuation detecting circuit connected to each of a light fluctuation detection control terminal, the photoelectric node, and an input terminal of the voltage follower circuit, an output terminal of the voltage follower circuit being connected to the follower node,
   wherein the light fluctuation detecting circuit is configured to enable or disable a connection between the photoelectric node and the input terminal of the voltage follower circuit under the control of the light fluctuation detection control terminal, and further configured such that when the light fluctuation detecting circuit is turned off, a drain current flowing through the light fluctuation detecting circuit changes as brightness of light received by the light fluctuation detecting circuit changes; and
   wherein a voltage at the output node is used to determine brightness of light received by the photoelectric conversion circuit and to determine whether there is a fluctuation in the brightness of the light received by the photoelectric conversion circuit.

2. The light detecting device according to claim 1, further comprising:
   a photoelectric detection circuit connected to the output node and configured to detect the voltage at the output node; and
   a light fluctuation determining circuit connected to the photoelectric detection circuit and configured to determine whether there is the fluctuation in the brightness of the light received by the photoelectric conversion circuit based on the voltage at the output node.

3. The light detecting device according to claim 1, wherein:
   the light fluctuation detecting circuit comprises a light fluctuation detecting transistor,
   a gate electrode of the light fluctuation detecting transistor is a control terminal of the light fluctuation detecting circuit,
   a first electrode of the light fluctuation detecting transistor is connected to the input terminal of the voltage follower circuit, a second electrode of the light fluctuation detecting transistor is connected to the photoelectric node, and
a drain current of the light fluctuation detecting transistor changes as brightness of light received by the light fluctuation detecting transistor changes.

4. The light detecting device according to claim 2, wherein:
the light fluctuation determining circuit is further configured to output a corresponding fluctuation indication signal based on a result of the determination of whether there is the fluctuation in the brightness of the light received by the photoelectric conversion circuit; and
the light detecting device further comprises an optical signal processing circuit connected to the light fluctuation determining circuit and the photoelectric detection circuit, and configured to process the voltage at the output node detected by the photoelectric detection circuit based on the fluctuation indication signal and to obtain brightness of corresponding light based on a voltage obtained after the processing.

5. The light detecting device according to claim 4, wherein:
the photoelectric detection circuit comprises a voltage acquiring sub-circuit connected to the output node and configured to acquire an output voltage, the output voltage being the voltage at the output node; or
the photoelectric detection circuit comprises:
a voltage amplifying sub-circuit connected to the output node and configured to amplify the voltage at the output node to obtain an amplified output voltage; and
a voltage acquiring sub-circuit connected to the voltage amplifying sub-circuit and configured to acquire the amplified output voltage.

6. The light detecting device according to claim 5, wherein the voltage follower circuit comprises:
a source follower transistor having a gate electrode that is the input terminal of the voltage follower circuit, a first electrode that is the output terminal of the voltage follower circuit, and a second electrode connected to a high voltage input terminal; and
a current source having a first terminal connected to the output node and a second terminal connected to a low voltage input terminal, and configured to provide a bias current flowing from the output node to the low voltage input terminal.

7. The light detecting device according to claim 6, wherein:
the reset circuit comprises a reset transistor having a gate electrode connected to the reset control terminal, a first electrode connected to the reset voltage terminal, and a second electrode connected to the photoelectric node;
the photoelectric conversion circuit comprises a photodiode having an anode connected to a photoelectric voltage terminal and a cathode connected to the photoelectric node, the photodiode being in a reverse biased state; and
the selection circuit comprises a selection transistor having a gate electrode connected to the selection control terminal, a first electrode connected to the follower node, and a second electrode connected to the output node.

8. The light detecting device according to claim 7, wherein the light detecting device further comprises one or more light blocking layers configured to prevent the reset transistor, the source follower transistor and the selection transistor from being illuminated.

9. A light detecting method applied to a light detecting device that comprises:
a reset circuit connected to a reset control terminal, a reset voltage terminal and a photoelectric node;
a photoelectric conversion circuit connected to the photoelectric node and configured to convert a received optical signal into a corresponding electrical signal, wherein the optical signal is output by a light source; a voltage follower circuit;
a selection circuit connected to a selection control terminal, a follower node and an output node; and
a light fluctuation detecting circuit connected to each of a light fluctuation detection control terminal, the photoelectric node and an input terminal of the voltage follower circuit, an output terminal of the voltage follower circuit being connected to the follower node;
wherein the light fluctuation detecting circuit is configured to enable or disable a connection between the photoelectric node and the input terminal of the voltage follower circuit under the control of the light fluctuation detection control terminal; and when the light fluctuation detecting circuit is turned off, a drain current flowing through the light fluctuation detecting circuit changes as brightness of light received by the light fluctuation detecting circuit changes; and
a voltage at the output node is used to determine brightness of light received by the photoelectric conversion circuit and to determine whether there is a fluctuation in the brightness of the light received by the photoelectric conversion circuit,
the light detecting method comprises in a detection cycle:
controlling, by the reset circuit, a connection between the reset voltage terminal and the photoelectric node to be enabled under the control of the reset control terminal; enabling, by the light fluctuation detecting circuit, the connection between the photoelectric node and the input terminal of the voltage follower circuit under the control of the light fluctuation detection control terminal; and controlling, by the selection circuit, a connection between the follower node and the output node to be enabled under the control of the selection control terminal, in a reset period;
controlling, by the reset circuit, the connection between the reset voltage terminal and the photoelectric node to be disabled under the control of the reset control terminal; disabling, by the light fluctuation detecting circuit, the connection between the photoelectric node and the input terminal of the voltage follower circuit under the control of the light fluctuation detection control terminal, wherein the voltage at the output terminal of the voltage follower circuit changes as a voltage at the input terminal of the voltage follower circuit changes; and controlling, by the selection circuit, the connection between the follower node and the output node to be enabled under the control of the selection control terminal, in a first acquisition period;
controlling, by the selection circuit, the connection between the follower node and the output node to be disabled under the control of the selection control terminal, in a detection interval period; and
changing the voltage at the output terminal of the voltage follower circuit as the voltage at the input terminal of the voltage follower circuit changes; and controlling, by the selection circuit, the connection between the follower node and the output node to be enabled under the control the selection control terminal, in a second acquisition period.

10. The light detecting method according to claim 9, wherein the light detecting device further comprises a photoelectric detection circuit and a light fluctuation determining circuit, the light detecting method further comprising:
   detecting, by the photoelectric detection circuit, the voltage at the output node, which voltage is a first output voltage, in the first acquisition period; and
   detecting, by the photoelectric detection circuit, the voltage at the output node, which voltage is a second output voltage, and determining, by the light fluctuation determining circuit, whether there is the fluctuation in the brightness of the light received by the photoelectric conversion circuit based on a voltage difference between the second output voltage and the first output voltage, and outputting, by the light fluctuation determining circuit, a corresponding fluctuation indication signal, in the second acquisition period.

11. The light detecting method according to claim 10, wherein the determining, by the light fluctuation determining circuit, whether there is the fluctuation in the brightness of the light received by the photoelectric conversion circuit based on the voltage difference between the second output voltage and the first output voltage, and outputting, by the light fluctuation determining circuit, the corresponding fluctuation indication signal comprises:
   outputting, by the light fluctuation determining circuit, a first fluctuation indication signal when the light fluctuation determining circuit determines that the voltage difference is within a predetermined voltage difference range; or
   outputting, by the light fluctuation determining circuit, a second fluctuation indication signal when the light fluctuation determining circuit determines that the voltage difference is not within the predetermined voltage difference range.

12. The light detecting method according to claim 11, wherein the detection cycle further comprises a third acquisition period subsequent to the second acquisition period; and the light detecting device comprises an optical signal processing circuit;
   the light detecting method further comprising:
   enabling, by the light fluctuation detecting circuit, the connection between the photoelectric node and the input terminal of the voltage follower circuit under the control of the light fluctuation detection control terminal, wherein the voltage at the output terminal of the voltage follower circuit changes as the voltage at the input terminal of the voltage follower circuit changes; controlling, by the selection circuit, the connection between the follower node and the output node to be enabled under the control of the selection control terminal; and
   detecting, by the photoelectric detection circuit, the voltage at the output node, which voltage is a third output voltage, in the third acquisition period;
   obtaining, by the optical light processing circuit, brightness of corresponding light based on a voltage difference between the third output voltage and the first output voltage, when the light fluctuation determining circuit outputs the first fluctuation indication signal; and
   filtering and weighting, by the optical signal processing circuit, the voltage difference to obtain a weighted voltage difference, and obtaining, by the optical signal processing circuit, the brightness of the corresponding light based on the weighted voltage difference, when the light fluctuation determining circuit outputs the second fluctuation indication signal.

13. A display device comprising:
   a light source; and
   a light detecting device that comprises a reset circuit connected to a reset control terminal, a reset voltage terminal and a photoelectric node; a photoelectric conversion circuit connected to the photoelectric node and configured to convert a received optical signal into a corresponding electrical signal, the optical signal being output by a light source; a voltage follower circuit; a selection circuit connected to a selection control terminal, a follower node and an output node; and a light fluctuation detecting circuit connected to each of a light fluctuation detection control terminal, the photoelectric node and an input terminal of the voltage follower circuit, an output terminal of the voltage follower circuit being connected to the follower node; wherein the light fluctuation detecting circuit is configured to enable or disable a connection between the photoelectric node and the input terminal of the voltage follower circuit under the control of the light fluctuation detection control terminal; and when the light fluctuation detecting circuit is turned off, a drain current flowing through the light fluctuation detecting circuit changes as brightness of light received by the light fluctuation detecting circuit changes; and a voltage at the output node is used to determine brightness of light received by the photoelectric conversion circuit and to determine whether there is a fluctuation in the brightness of the light received by the photoelectric conversion circuit.

14. The display device according to claim 13, wherein the light detecting device further comprises:
   a photoelectric detection circuit connected to the output node and configured to detect the voltage at the output node; and
   a light fluctuation determining circuit connected to the photoelectric detection circuit and configured to determine whether there is the fluctuation in the brightness of the light received by the photoelectric conversion circuit based on the voltage at the output node.

15. The display device according to claim 13, wherein the light fluctuation detecting circuit comprises a light fluctuation detecting transistor,
   a gate electrode of the light fluctuation detecting transistor is a control terminal of the light fluctuation detecting circuit,
   a first electrode of the light fluctuation detecting transistor is connected to the input terminal of the voltage follower circuit,
   a second electrode of the light fluctuation detecting transistor is connected to the photoelectric node, and
   a drain current of the light fluctuation detecting transistor changes as brightness of light received by the light fluctuation detecting transistor changes.

16. The display device according to claim 14, wherein the light fluctuation determining circuit is further configured to output a corresponding fluctuation indication signal based on a result of the determination of whether there is the fluctuation in the brightness of the light received by the photoelectric conversion circuit; and
   the light detecting device further comprises an optical signal processing circuit connected to the light fluctuation determining circuit and the photoelectric detection circuit, and configured to process the voltage at the output node detected by the photoelectric detection circuit based on the fluctuation indication signal and to obtain brightness of corresponding light based on a voltage obtained after the processing.

17. The display device according to claim 16, wherein the photoelectric detection circuit comprises a voltage acquiring sub-circuit connected to the output node and configured to acquire an output voltage, the output voltage being the voltage at the output node; or, the photoelectric detection circuit comprises:
  a voltage amplifying sub-circuit connected to the output node and configured to amplify the voltage at the output node to obtain an amplified output voltage; and
  a voltage acquiring sub-circuit connected to the voltage amplifying sub-circuit and configured to acquire the amplified output voltage.

18. The display device according to claim 17, wherein the voltage follower circuit comprises:
  a source follower transistor having a gate electrode that is the input terminal of the voltage follower circuit, a first electrode that is the output terminal of the voltage follower circuit, and a second electrode connected to a high voltage input terminal; and
  a current source having a first terminal connected to the output node and a second terminal connected to a low voltage input terminal, and configured to provide a bias current flowing from the output node to the low voltage input terminal.

19. The display device according to claim 18, wherein the reset circuit comprises a reset transistor having a gate electrode connected to the reset control terminal, a first electrode connected to the reset voltage terminal, and a second electrode connected to the photoelectric node;

the photoelectric conversion circuit comprises a photodiode having an anode connected to a photoelectric voltage terminal and a cathode connected to the photoelectric node, the photodiode being in a reverse biased state; and the selection circuit comprises a selection transistor having a gate electrode connected to the selection control terminal, a first electrode connected to the follower node, and a second electrode connected to the output node.

20. The display device according to claim 19, wherein the light detecting device further comprises one or more light blocking layers configured to prevent the reset transistor, the source follower transistor and the selection transistor from being illuminated.

* * * * *